(12) United States Patent
Lee

(10) Patent No.: US 9,673,051 B1
(45) Date of Patent: Jun. 6, 2017

(54) HIGH DENSITY PATTERNED MATERIAL ON INTEGRATED CIRCUITS

(71) Applicant: MACRONIX INTERNATIONAL CO., LTD., Hsinchu (TW)

(72) Inventor: Guan-Ru Lee, Kaohsiung (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 0 days.

(21) Appl. No.: 14/996,014

(22) Filed: Jan. 14, 2016

(51) Int. Cl.
*H01L 23/48* (2006.01)
*H01L 21/033* (2006.01)
*H01L 21/768* (2006.01)
*H01L 23/528* (2006.01)

(52) U.S. Cl.
CPC .... *H01L 21/0338* (2013.01); *H01L 21/76895* (2013.01); *H01L 23/5283* (2013.01)

(58) Field of Classification Search
CPC ............... H01L 23/5283; H01L 23/528; H01L 23/49838; H01L 21/0338; H01L 21/76895
USPC ................... 257/773, 786; 438/942
See application file for complete search history.

(56) References Cited

U.S. PATENT DOCUMENTS

| | | | | |
|---|---|---|---|---|
| 5,328,810 | A * | 7/1994 | Lowrey | H01L 21/0271 148/DIG. 106 |
| 7,205,241 | B2 * | 4/2007 | Park | H01L 21/76895 257/E21.019 |
| 7,361,569 | B2 * | 4/2008 | Tran | H01L 21/0337 257/E21.023 |
| 8,922,020 | B2 | 12/2014 | Chen et al. | |
| 8,941,166 | B2 | 1/2015 | Chen et al. | |
| 2005/0142497 | A1 * | 6/2005 | Ryou | H01L 21/0337 430/311 |
| 2006/0211260 | A1 * | 9/2006 | Tran | H01L 21/0337 438/763 |
| 2007/0212892 | A1 * | 9/2007 | Caspary | H01L 21/0338 438/736 |
| 2008/0181007 | A1 * | 7/2008 | Knoefler | H01L 21/76838 365/185.17 |
| 2010/0248153 | A1 * | 9/2010 | Lee | H01L 21/0337 430/312 |
| 2014/0264893 | A1 * | 9/2014 | Pratt | H01L 23/528 257/773 |

(Continued)

OTHER PUBLICATIONS

Peng Xie et al., "Analysis of Higher Order Pitch Division for sub-32nm Lithography," Optical Microlithography XXII, Proc. of SPIE, vol. 7274, 72741Y, 2009, pp. 1-8.

*Primary Examiner* — Nitin Parekh
(74) *Attorney, Agent, or Firm* — Haynes Beffel & Wolfeld LLP

(57) ABSTRACT

An integrated circuit comprises a plurality of strips of material over a substrate, the plurality of strips including strips S(i), each strip S(i) for i going from 3 to n having a first segment and a second segment separated by a gap from the first segment. The integrated circuit comprises a plurality of landing areas, the plurality of landing areas including landing areas A(i), each landing area A(i) for i going from 3 to n−2 connecting a first segment of strip S(i) in the plurality of strips with a second segment of strip S(i+2) in the plurality of strips, and disposed within the gap between the first and second segments in strip S(i+1). The strips S(i) have a first pitch in a direction orthogonal to the strips, and the landing areas A(i) have a second pitch twice the first pitch in the direction orthogonal to the strips of material.

20 Claims, 13 Drawing Sheets

(56) References Cited

U.S. PATENT DOCUMENTS

2016/0329241 A1* 11/2016 Lin .................. H01L 21/76816

* cited by examiner

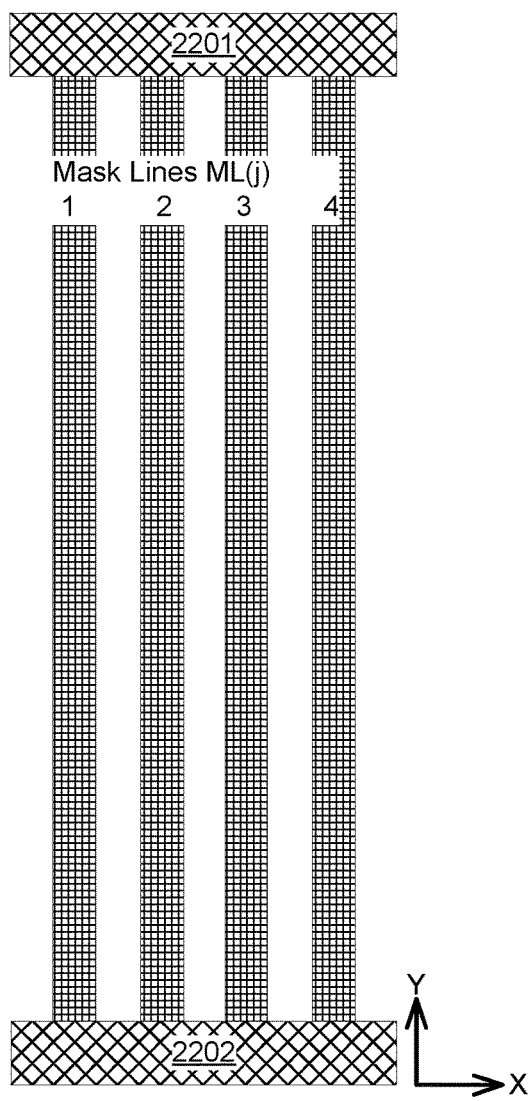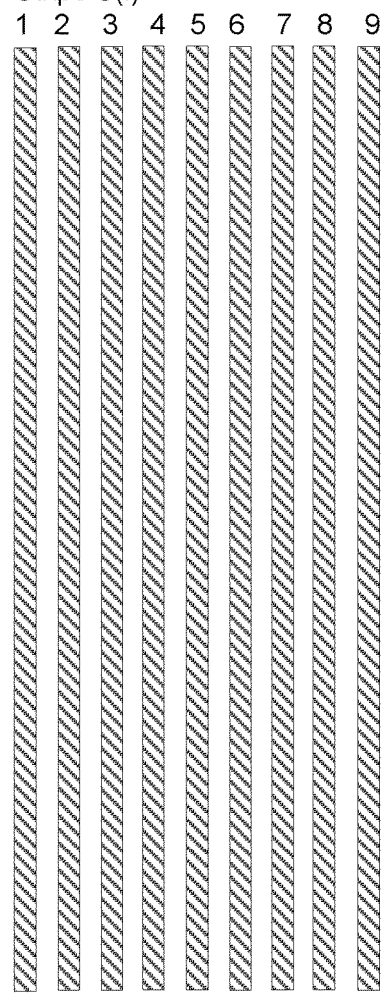
Fig. 22A                    Fig. 22B

HIGH DENSITY PATTERNED MATERIAL ON INTEGRATED CIRCUITS

BACKGROUND

Field of the Technology

The technology disclosed relates to patterned strips of material and contact areas on integrated circuits and their fabrication, including the use of multiple patterning methods to fabricate integrated circuits by which access to the strips of material formed thereby is facilitated.

Description of Related Art

Integrated circuits are commonly used to make a wide variety of electronic devices, such as memory chips. There is a strong desire to reduce the size of integrated circuits, so as to increase the density of the individual components and consequently enhance the functionality of an integrated circuit. The minimum pitch on an integrated circuit (the minimum distance between the same points of two adjacent structures of the same type, e.g., two adjacent gate conductors) is often used as a representative measure of the circuit's density.

Increases in circuit density often are limited by the resolution of the available photolithographic equipment. The minimum size of features and spaces that a given piece of photolithographic equipment can produce is related to its resolution capacity.

The sum of the minimum feature width and minimum space width producible with a given piece of photolithographic equipment is the minimum pitch that the piece of equipment can produce. The minimum feature width can often times be approximately equal to the minimum space width, so the minimum pitch that can be produced with a given piece of photolithographic equipment is approximately equal to double the minimum feature width that it can produce.

One way to reduce the pitch of an integrated circuit device below that of the minimum pitch produced lithographically is through the use of double or quadruple patterning, sometimes referred to as multiple patterning herein. Through this method a single mask is typically used to create a series of parallel strips of material on the substrate. Different methods can then be used to transform each parallel strip of material into multiple parallel strips of material. The various methods typically use a series of deposition and etching steps to do so. Different methods are discussed in Xie, Peng and Smith, Bruce W., "*Analysis of Higher-Order Pitch Division for Sub-32 nm Lithography*", Optical Microlithography XXII, Proc. of SPIE Vol. 7274, 72741Y, © 2009 SPIE.

Strips of material at a level are connected to another level through interlayer connectors that land on the landing areas. The interlayer connectors are formed using different patterning steps, that may have larger minimum pitch than the patterning steps used for the denser strips. As the parallel strips of material are scaled down by multiple patterning processes for higher density, a pitch required of the landing areas for interlayer connectors that connect the parallel strips becomes greater than a pitch of the parallel strips of material.

It is desirable to provide technology which can create landing areas that have a pitch greater than a pitch of the parallel strips of material without relaxing the pitch of the parallel strips of material, which can be the minimum pitch that can be produced with a given piece of photolithographic equipment.

SUMMARY

An integrated circuit comprises a plurality of strips of material over a substrate, and a plurality of landing areas. The plurality of strips includes strips S(i), each strip S(i) for i going from 3 to n having a first segment and a second segment separated by a gap from the first segment. On opposite sides of the gap, the first and second segments of the strip S(i) are aligned, so that the first and second segments are disposed in a straight line. The plurality of landing areas includes landing areas A(i), each landing area A(i) for i going from 3 to n−2 connecting a first segment of strip S(i) in the plurality of strips with a second segment of strip S(i+2) in the plurality of strips, and being disposed within the gap between the first and second segments in strip S(i+1). The strips S(i) have a first pitch in a direction orthogonal to the strips, and the landing areas A(i) can have a second pitch twice the first pitch in the direction orthogonal to the strips of material. The strips S(i) can include conductive material, and be disposed in a level such as metal level 2.

The gaps in strips S(i) have lengths in a direction parallel to the strips, and landing areas A(i) have a width in the direction parallel to the strips less than a length of the gap between the first and second segments of strip S(i+1). Adjacent landing areas A(i) and A(i+1) in the plurality of landing areas are offset in the direction parallel to the strips. The offset can be at least the length of the gap between the first and second segments of strip S(i+1). Adjacent landing areas A(i) and A(i+1) in the plurality of landing areas can have a pitch in the direction parallel to the strips equal to the length of the gap between the first and second segments of strip S(i+1). Adjacent landing areas A(i) and A(i+1) in the plurality of landing areas can be offset by the first pitch in the direction orthogonal to the strips of material.

In the integrated circuit, for the strips S(i), for i going from 3 to n, each strip S(i) can have a third segment separated by a gap from the second segment. On opposite sides of the gap, the second and third segments of the strip S(i) are aligned, so that the second and third segments are disposed in a straight line. The integrated circuit can include a second plurality of landing areas. The second plurality of landing areas includes landing areas A2(*i*), for i going from 3 to n, each landing area A2(*i*) connecting the third segment of strip S(i) in the plurality of strips with the second segment of strip S(i+2) and disposed within the gap between the second and third segments in strip S(i+1). The landing areas A2(*i*) in the second plurality have the second pitch twice the first pitch in the direction orthogonal to the strips of material. The landing areas A(i) in the first mentioned plurality and the landing areas A2(*i*) in the second plurality are laid out in mirror image in the direction parallel to the plurality of strips.

The plurality of strips of material and the plurality of landing areas described herein can be used for any dense or tightly pitched strips of material in integrated circuits, such as integrated circuit memories, CPUs (central processing units), FPGAs (field programmable gate arrays), etc. The tight pitched plurality of strips of material can include global word lines, global bit lines, local word lines, local bit lines, busses, etc.

A method for manufacturing a memory device as described herein is also provided.

Other aspects and advantages of the present technology can be seen on review of the drawings, the detailed description and the claims, which follow.

BRIEF DESCRIPTION OF THE DRAWINGS

FIG. 22A shows a second mask in addition to the first mentioned mask as described in connection with FIGS. 3 and 4.

FIG. 22B shows the strip ends of the plurality of strips of material S(i) after being cut using the second mask.

DETAILED DESCRIPTION

Figure 1:
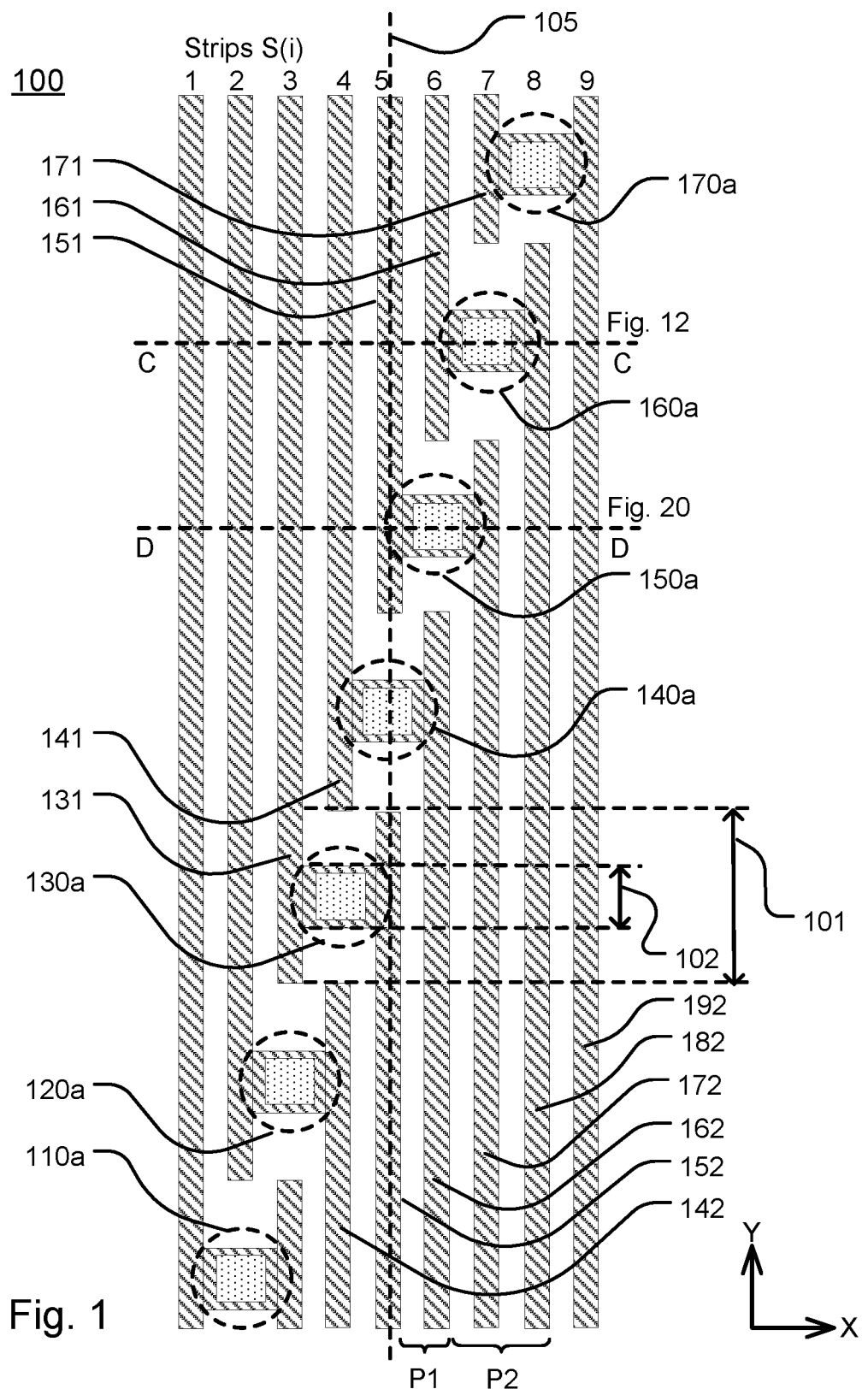
FIG. 1 is a top plan view of a plurality of strips of material, and a plurality of landing areas connecting segments of the strips.

A detailed description of embodiments of the present technology is provided with reference to the Figures. It is to be understood that there is no intention to limit the technology to the specifically disclosed structural embodiments and methods but that the technology may be practiced using other features, elements, methods and embodiments. Preferred embodiments are described to illustrate the present technology, not to limit its scope, which is defined by the claims. Those of ordinary skill in the art will recognize a variety of equivalent variations on the description that follows. Like elements in various embodiments are commonly referred to with like reference numerals.

FIG. 1 is a top plan view of a plurality of strips of material over a substrate, and a plurality of landing areas connecting segments of the strips, in an X-Y plane. As shown in FIG. 1, an integrated circuit includes a plurality of strips of material (e.g. Strips 1-9). The plurality of strips includes strips S(i), where each strip S(i) for i going from 3 to n has a first segment and a second segment separated by a gap from the first segment. On opposite sides of the gap, the first and second segments (e.g. 151, 152) of the strip S(i) (e.g. S(5)) are aligned, so that the first and second segments are disposed in a straight line (e.g. 105). Although n=9 as shown in the example of FIG. 1, n can be greater than 9, for example, 32, 64, 128, etc.

The integrated circuit includes a plurality of landing areas (e.g. 110a, 120a, 130a, 140a, 150a, 160a and 170a). The plurality of landing areas includes landing areas A(i), where each landing area A(i) for i going from 3 to n−2 connects a first segment of strip S(i) in the plurality of strips with a second segment of strip S(i+2) in the plurality of strips, and landing area A(i) is disposed within the gap between the first and second segments in strip S(i+1).

For instance, for i=3, landing area A(3) (e.g 130a) connects a first segment of strip S(3) (e.g. 131) in the plurality of strips with a second segment of strip S(5) (e.g. 152) in the plurality of strips, and landing area A(3) (e.g 130a) is disposed within the gap between the first and second segments (e.g. 141 and 142) in strip S(4). For instance, for i=6, landing area A(6) (e.g 160a) connects a first segment of strip S(6) (e.g. 161) in the plurality of strips with a second segment of strip S(8) (e.g. 182) in the plurality of strips, and landing area A(6) (e.g 160a) is disposed within the gap between the first and second segments (e.g. 171 and 172) in strip S(7).

In the present technology, for i going from 1 to n, (n−2) landing areas in the plurality of landing areas A(i) connect n strips in the plurality of strips S(i). For instance, for n=9 as shown in FIG. 1, 7 landing areas (e.g. 110a, 120a, 130a, 140a, 150a, 160a and 170a) in the plurality of landing areas connect 9 strips in the plurality of strips.

The strips S(i) have a first pitch (e.g. P1) in a direction orthogonal to the strips (e.g. X-direction), and the landing areas A(i) have a second pitch (e.g. P2) twice the first pitch in the direction orthogonal to the strips of material. The first pitch can be defined by a self-aligned double patterning process. For instance, the first pitch can be less than 40 nm (nanometer).

The gaps in strips S(i) have lengths (e.g. 101) in a direction parallel to the strips (e.g. Y-direction), and landing areas A(i) have a width (e.g. 102) in the direction parallel to the strips. The width (e.g. 102) of landing areas A(i) is less than a length of the gap (e.g. 101) between the first and second segments of strip S(i+1). For instance, for i=6, the width (e.g. 102) of landing areas A(6) (e.g. 160a) is less than a length of the gap (e.g. 101) between the first and second segments of strip S(7).

Adjacent landing areas A(i) and A(i+1) in the plurality of landing areas are offset in the direction parallel to the strips. For instance, for i=6, adjacent landing areas A(6) and A(7) (e.g. 160a and 170a) in the plurality of landing areas are offset in the direction parallel to the strips.

The offset between adjacent landing areas A(i) and A(i+1) in the direction parallel to the strips is at least the length of the gap between the first and second segments of strip S(i+1). For instance, for i=6, the offset between adjacent landing areas A(6) and A(7) (e.g. 160a and 170a) in the direction parallel to the strips is at least the length of the gap between the first and second segments (e.g. 171 and 172) of strip S(7).

Adjacent landing areas A(i) and A(i+1) in the plurality of landing areas can have a pitch in the direction parallel to the strips equal to the length of the gap between the first and second segments of strip S(i+1). For instance, for i=6, adjacent landing areas A(6) and A(7) (e.g. 160a and 170a) in the plurality of landing areas can have a pitch in the direction parallel to the strips equal to the length of the gap (e.g. 101) between the first and second segments (e.g. 171 and 172) of strip S(7).

Adjacent landing areas A(i) and A(i+1) in the plurality of landing areas are offset by the pitch in the direction orthogonal to the strips of material. For instance, for i=3, adjacent landing areas A(3) and A(4) (e.g. 130a and 140a) in the plurality of landing areas are offset by the pitch (P1) in the direction orthogonal to the strips of material.

Figure 2:
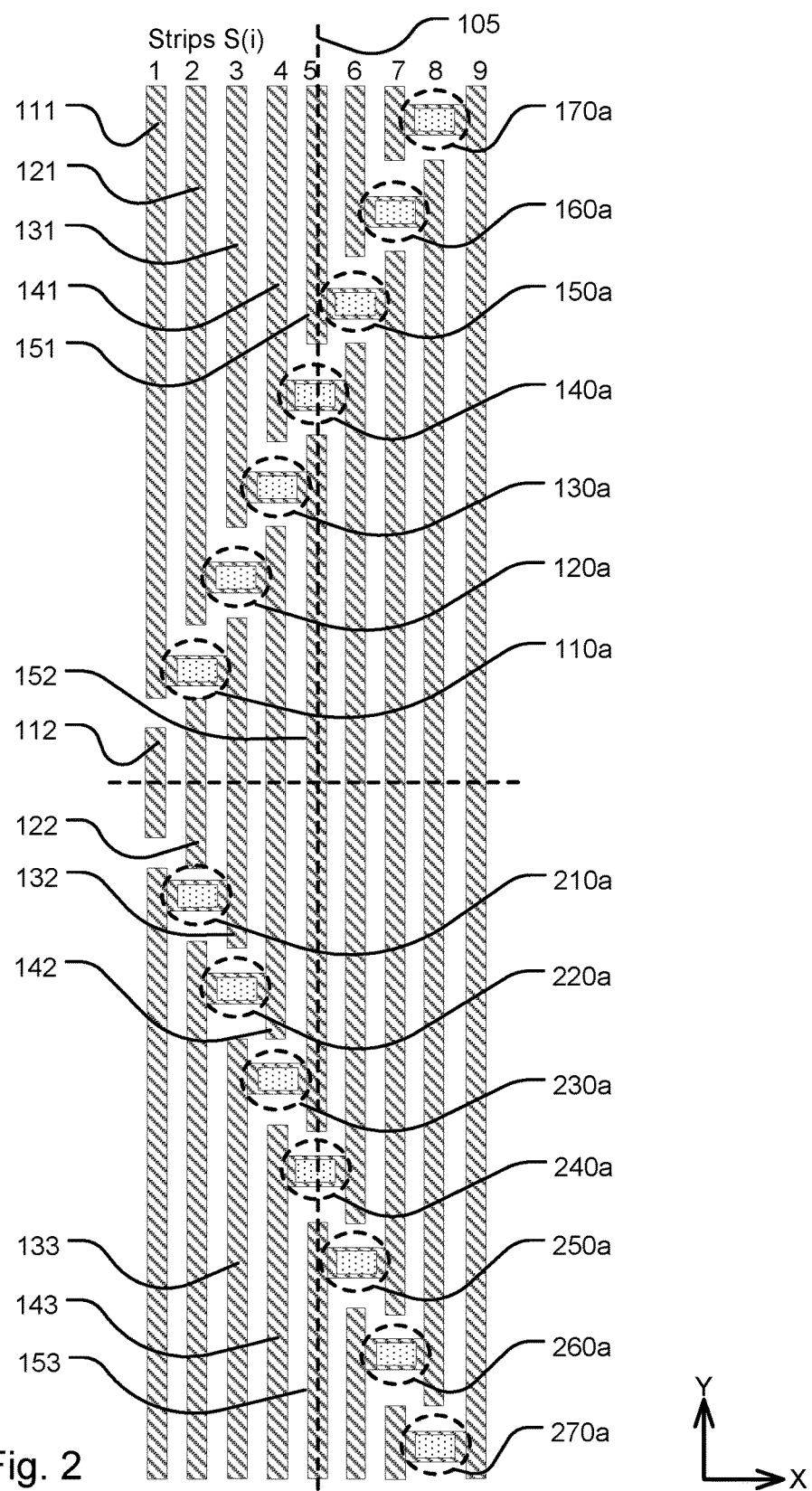
FIG. 2 is a top plan view of a plurality of strips of material, a first mentioned plurality of landing areas as described in connection with FIG. 1, and a second plurality of landing areas laid out in mirror image of the first mentioned plurality of landing areas.

FIG. 2 is a top plan view of a plurality of strips of material, a first mentioned plurality of landing areas as described in connection with FIG. 1, and a second plurality of landing areas laid out in mirror image of the first mentioned plurality of landing areas, in an X-Y plane. Like elements in FIG. 2 are referred to with like reference numerals in FIG. 1.

In the example shown in FIG. 2, for the strips S(i), for i going from 3 to n, each strip S(i) can have a third segment separated by a gap from the second segment. For instance, for i=5, strip S(5) can have a third segment (e.g. 153) separated by a gap (e.g. 240a) from the second segment (e.g. 152). On opposite sides of the gap, the second and third segments (e.g. 152, 153) of the strip S(i) (e.g. S(5)) are aligned, so that the second and third segments are disposed in a straight line (e.g. 105).

In addition to the first mentioned plurality of landing areas shown in FIG. 1 (e.g. 110a, 120a, 130a, 140a, 150a, 160a and 170a), the integrated circuit can include a second plurality of landing areas (e.g. 210a, 220a, 230a, 240a, 250a, 260a and 270a). The second plurality of landing areas includes landing areas A2(i), for i going from 3 to n. Each landing area A2(i) connects the third segment of strip S(i) in the plurality of strips with the second segment of strip S(i+2), and is disposed within the gap between the second and third segments in strip S(i+1). For instance, for i=3, landing area A2(3) (e.g. 230a) connects the third segment of strip S(3) (e.g. 133) in the plurality of strips with the second segment of strip S(5) (e.g. 152), and landing area A2(3) (e.g. 230a) is disposed within the gap between the second and third segments (e.g. 142 and 143) in strip S(4).

The strips S(i) have a first pitch (e.g. P1) in a direction orthogonal to the strips (e.g. X-direction), and the landing areas A2(i) in the second plurality have the second pitch (e.g. P2) twice the first pitch (e.g. P1) in the direction orthogonal to the strips of material.

The landing areas A(i) in the first mentioned plurality (e.g. 110a, 120a, 130a, 140a, 150a, 160a and 170a), and the landing areas A2(i) in the second plurality (e.g. 210a, 220a, 230a, 240a, 250a, 260a and 270a) are laid out in mirror image in the direction parallel to the plurality of strips (e.g. Y-direction).

In implementations, in the plurality of strips of material, two left-side strips may not have second segments, and two right-side strips may not have first segments. For instance, two left-side strips S(1) and S(2) may not have second segments 112 and 122 below first segment 111 of strip S(1) and below landing area 110a respectively. For instance, for n=9, two right-side strips S(n-1) and S(n) may not have first segments above landing area 170a and above second segment 192 of strip S(9) respectively (not shown). Consequently, for i<3, strip S(i) may not have a second segment; for i=3, strips S(i-1) and S(i-2) may not have second segments; and for i=4, strip S(i-2) may not have a second segment.

In other implementations, in the plurality of strips of material, two left-side strips may have second segments (e.g. 112 and 122) and/or two right-side strips may have first segments. In such implementations, landing areas in the plurality of landing areas do not connect the second segments of the two left-side strips, and do not connect the first segments of the two right-side strips. The second segments of the two left-side strips and the first segments of the two right-side strips may be referred to as dummy segments.

Although the index (i) for the plurality of strips and for the plurality of landing areas increases from left to right in the present description, the plurality of strips and the plurality of landing areas can be descried in the same way with the index (i) increasing from right to left. For instance, if the index (i) increases from right to left, then in the plurality of strips of material, two right-side strips S(1) and S(2) may not have first segments, and two left-side strips S(n-1) and S(n) may not have second segments. For instance, if the index (i) increases from right to left, then in the first mentioned plurality of landing areas, each landing area A(i) for i going from 3 to n-2 connects a first segment of strip S(i+2) in the plurality of strips with a second segment of strip S(i) in the plurality of strips, and disposed within the gap between the first and second segments in strip S(i+1).

Figure 3:
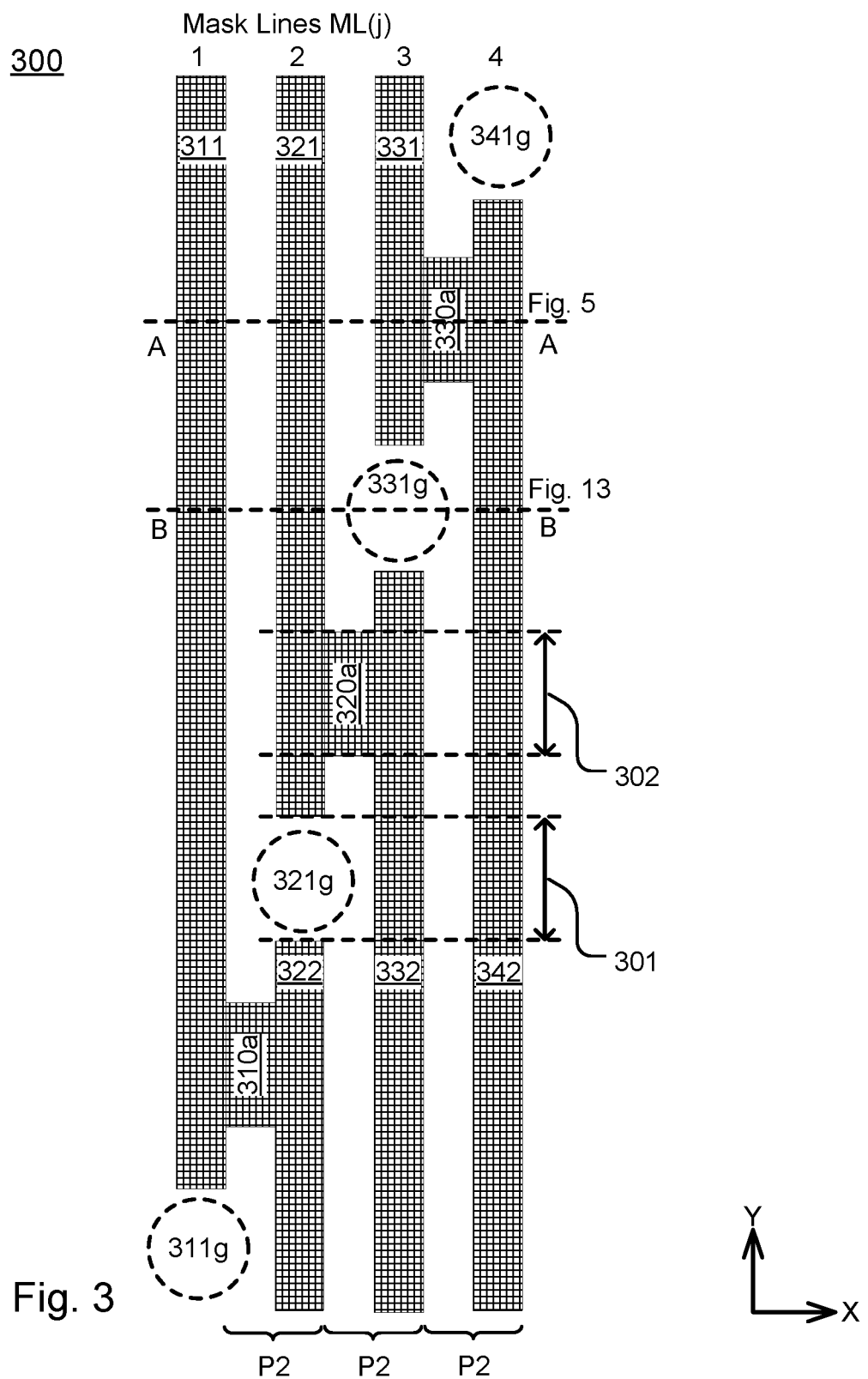
FIG. 3 shows a mask including a plurality of mask lines, and a plurality of mask areas connecting first and second segments of the mask lines separated by gaps.

FIG. 3 shows a mask 300 including a plurality of mask lines, and a plurality of mask areas connecting segments of the mask lines separated by gaps, in an X-Y plane. The mask can be a photolithographic mask that defines a pattern for fabrication of an integrated circuit as described herein. The pattern includes the mask lines and the mask areas that are opaque to light, and open areas between the mask lines that allow light to shine through. The mask is for use with a self-aligned double patterning process to manufacture the plurality of strips of material and the plurality of landing areas as described in connection with FIG. 1. The mask can be formed on a substrate of an integrated circuit. Although the substrate can be many suitable combinations of materials, in this example, the substrate has layers of materials including, from top to bottom, DARC (dielectric antireflective coating), a layer of sacrificial material such as APF (Advanced Patterning Film), a layer of semiconductor material such as amorphous silicon, an insulation layer 540 that can include IMD (intermetal dielectric) oxide, and an etch stopping layer that can include SiN (silicon nitride). A layer of IMD oxide can include materials such as PEOX, HDP OX, PETEOS OX, FSG, and PSG. The layers of materials can be formed on an array region of an integrated circuit memory that includes an array of memory cells.

The mask includes a plurality of mask lines (e.g. Mask Lines 1-4). The plurality of mask lines includes mask lines ML(j), where each mask line ML(j) for j going from 2 to m has a first segment (e.g. 321 and 331) and a second segment (e.g. 322, 332) separated by a mask gap (e.g. 321g, 331g) from the first segment. For instance, for j=2, mask line ML(j) has a first segment 321 and a second segment 322 separated by a mask gap 321g from the first segment 321.

Mask 300 includes a plurality of mask areas (e.g. 310a, 320a, 330a). The plurality of mask areas includes mask areas MA(j), where each mask area MA(j) for j going from 2 to m-1 connects a first segment of mask line ML(j) in the plurality of mask lines with a second segment of mask line ML(j+1) in the plurality of mask lines, and is disposed between mask line ML(j) and mask line ML(j+1).

For instance, for j=2, mask area MA(2) (e.g. 320a) connects a first segment 321 of mask line ML(2) in the plurality of mask lines with a second segment 332 of mask line ML(3) in the plurality of mask lines, and is disposed between mask line ML(2) and mask line ML(3). For instance, for m=4 and j=m-1=3, mask area MA(3) (e.g. 330a) connects a first segment 331 of mask line ML(3) in the plurality of mask lines with a second segment 342 of mask line ML(4) in the plurality of mask lines, and is disposed between mask line ML(3) and mask line ML(4).

The mask gaps (e.g. 321g) in mask lines have a length (e.g. 301) in a direction parallel to the mask lines (e.g. Y-direction), and mask areas (e.g 320a) have a width (e.g. 302) in the direction parallel to the mask lines. The width of the mask areas (e.g. 302) can be equal to the length of the mask gaps (e.g. 301). Mask area MA(j) between mask line ML(j) and mask line ML(j+1) and an adjacent mask gap in mask line ML(j+1) are offset in the direction parallel to the lines. For instance, for j=2, mask area MA(2) (e.g 320a)

between mask line ML(2) and mask line ML(3) and an adjacent mask gap (e.g. 331g) in mask line ML(3) are offset in the direction parallel to the lines. The offset is at least the length of the mask gaps (e.g. 301) or the width of the mask areas (e.g. 302).

Adjacent mask areas MA(j) and MA(j+1) in the plurality of mask areas are offset by a pitch of the mask lines (e.g. P2) in the direction orthogonal to the mask lines (e.g. X-direction). For instance, for j=2, mask areas MA(2) and MA(3) (e.g. 320a and 330a) in the plurality of mask areas are offset by the pitch of the mask lines P2 in the direction orthogonal to the mask lines. The pitch of the mask lines P2 in the direction orthogonal to the mask lines as described in connection with FIG. 3 is twice the first pitch P1 of the strips of material in the direction orthogonal to the strips of material as described in connection with FIG. 1.

Figure 4:
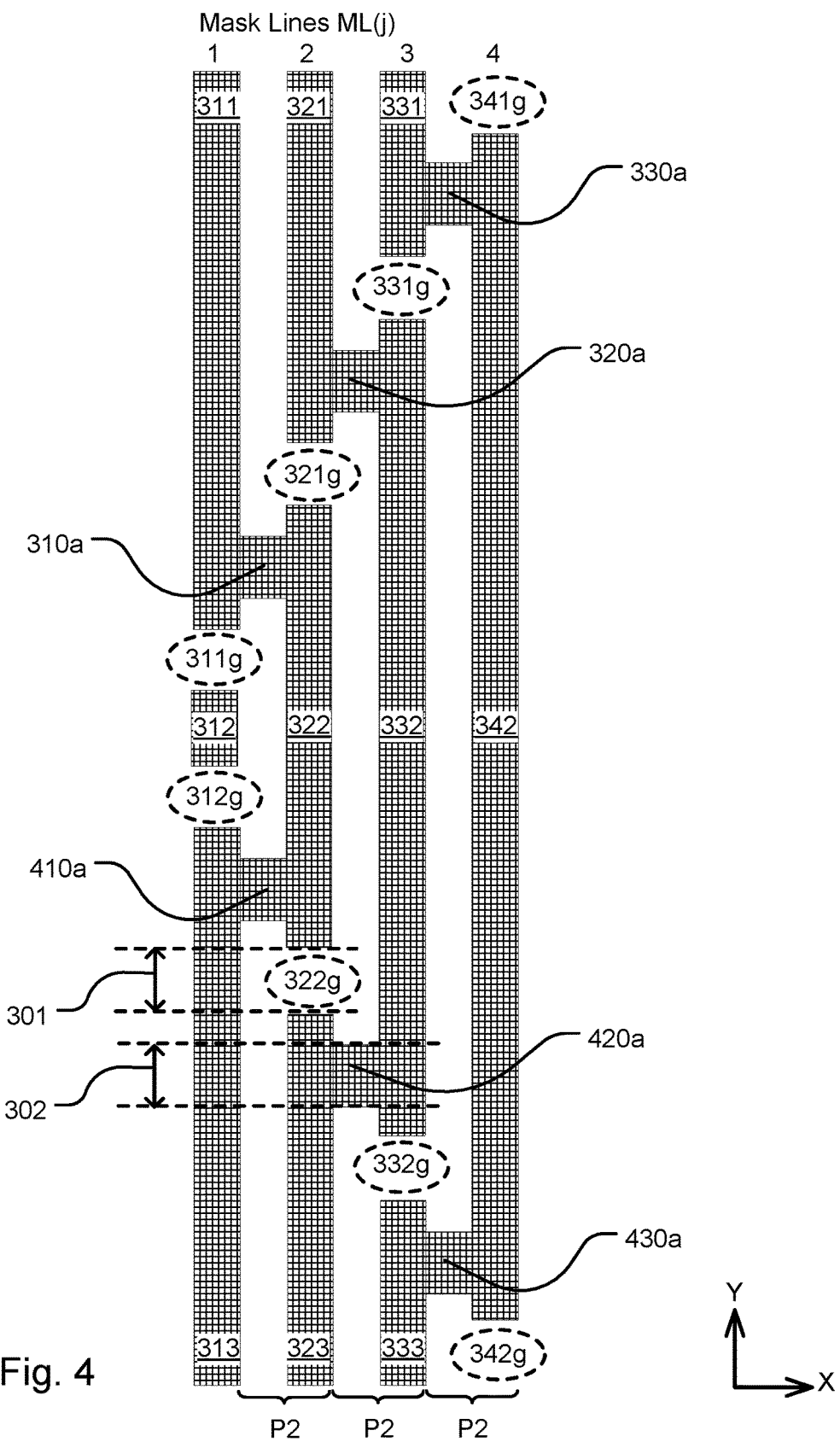
FIG. 4 shows a mask including a plurality of mask lines, and a plurality of mask areas as shown in FIG. 3, and a second plurality of mask areas connecting second and third segments of the mask lines separated by gaps.

FIG. 4 shows a mask including a plurality of mask lines, and a first mentioned plurality of mask areas as shown in FIG. 3, and a second plurality of mask areas connecting second and third segments of the mask lines separated by gaps, in an X-Y plane. Mask areas MA(j) in the first mentioned plurality of mask areas and mask areas MA2(j) in the second plurality of mask areas are laid out in mirror image in the direction parallel to the plurality of mask lines (e.g. Y-direction). The mask is for use with a self-aligned double patterning process to manufacture the plurality of strips of material and the plurality of landing areas as described in connection with FIG. 2. Like elements in FIG. 4 are referred to with like reference numerals in FIG. 3.

In the example shown in FIG. 4, for the mask lines ML(j), for j going from 2 to m, each mask line ML(j) can have a third segment separated by a mask gap from the second segment. For instance, for j=2, mask line ML(2) can have a third segment (e.g. 323) separated by a mask gap from the second segment (e.g. 322).

In addition to the first mentioned plurality of mask areas shown in FIG. 3 (e.g. 310a, 320a, 330a), the integrated circuit can include a second plurality of mask areas (e.g. 410a, 420a, 430a). The second plurality of mask areas includes mask areas MA2(j), for j going from 2 to m−1. Each mask area MA2(j) connects the third segment of mask line ML(j) in the plurality of mask lines with the second segment of mask line ML(j+1), and is disposed between mask line ML(j) and mask line ML(j+1). For instance, for j=2, mask area MA2(2) (e.g. 420a) connects the third segment (e.g. 323) of mask line ML(2) in the plurality of mask lines with the second segment (e.g. 332) of mask line ML(3), and is disposed between mask line ML(2) and mask line ML(3).

The mask gaps in mask lines ML(j) have a length in a direction parallel to the mask lines, and mask areas MA2(j) in the second plurality of mask areas have a width in the direction parallel to the mask lines. The width of the mask areas (e.g. 302) MA2(j) in the second plurality of mask areas can be equal to the length of the mask gaps (e.g. 301). Mask areas MA2(j) in the second plurality of mask areas between mask line ML(j) and mask line ML(j+1) and an adjacent mask gap in mask line ML(j+1) are offset in the direction parallel to the lines. For instance, in the second plurality of mask areas, for j=2, mask area MA2(2) (e.g 420a) between mask line ML(2) and mask line ML(3) and an adjacent mask gap (e.g. 332g) in mask line ML(3) are offset in the direction parallel to the lines. The offset is at least the length of the mask gaps (e.g. 301) or the width of the mask areas (e.g. 302).

Adjacent mask areas MA2(j) and MA2(j+1) in the second plurality of mask areas are offset by a pitch of the mask lines (e.g. P2) in the direction orthogonal to the mask lines (e.g. X-direction). For instance, for j=2, mask areas MA2(2) and MA2(3) (e.g. 420a and 430a) in the second plurality of mask areas are offset by the pitch of the mask lines P2 in the direction orthogonal to the mask lines. The pitch of the mask lines P2 in the direction orthogonal to the mask lines as described in connection with FIG. 4 is twice the first pitch P1 of the strips of material in the direction orthogonal to the strips of material as described in connection with FIG. 1.

In the plurality of mask lines of material, a left-most mask line (e.g. ML(1)) may have a second segment (e.g. 312) and/or a right-most mask line (e.g. ML(4)) may have a first segment (e.g. above mask gap 341g, not shown). Mask areas MA(j) in the first mentioned plurality of mask areas and mask areas MA2(j) in the second plurality of mask areas do not connect the second segment (e.g. 312) of the left-most mask line, and do not connect the first segment of the right-most mask line. In an implementation illustrated by FIG. 4, the second segment (e.g. 312) of the left-most mask line and the first segment of the right-most mask line can be referred to as dummy lines. In an alternative implementation, such dummy lines can be optional, depending on the layout and circuit design.

In a self-aligned double patterning process such as described in connection with FIGS. 5-20, the second segment in the left-most mask line and the first segment of the right-most mask line in the mask can be used in manufacturing of the second segments of the two left-side lines (e.g. 112, 122, FIG. 2) and the first segments of the two right-side lines, referred to as dummy segments, as described in connection with FIG. 2.

FIGS. 5 to 20 illustrate a self-aligned double patterning process on the substrate using the mask such as described in connection to FIG. 3 to manufacture a plurality of strips of material, and a plurality of landing areas connecting segments of the strips such as described in connection to FIG. 1.

FIGS. 5 to 12 and FIGS. 13 to 20 illustrate the same manufacturing steps in a self-aligned double patterning process using the same mask (e.g. 300, FIG. 3). The difference is that FIGS. 5 to 12 illustrate a cross-section taken at line AA through a mask area between two mask lines as shown in FIG. 3, while FIGS. 13 to 20 illustrate a cross-section through a mask gap in a mask line taken at line BB as shown in FIG. 3. The cross-sections in FIGS. 5 to 20 are in an X-Z plane, where the Z-direction is orthogonal to an X-Y plane as shown in FIGS. 1-4. The self-aligned double patterning process using the mask as described herein results in the strips S(i) having a first pitch in a direction orthogonal to the strips, and the landing areas A(i) having a second pitch twice the first pitch in the direction orthogonal to the strips of material.

Figure 5:
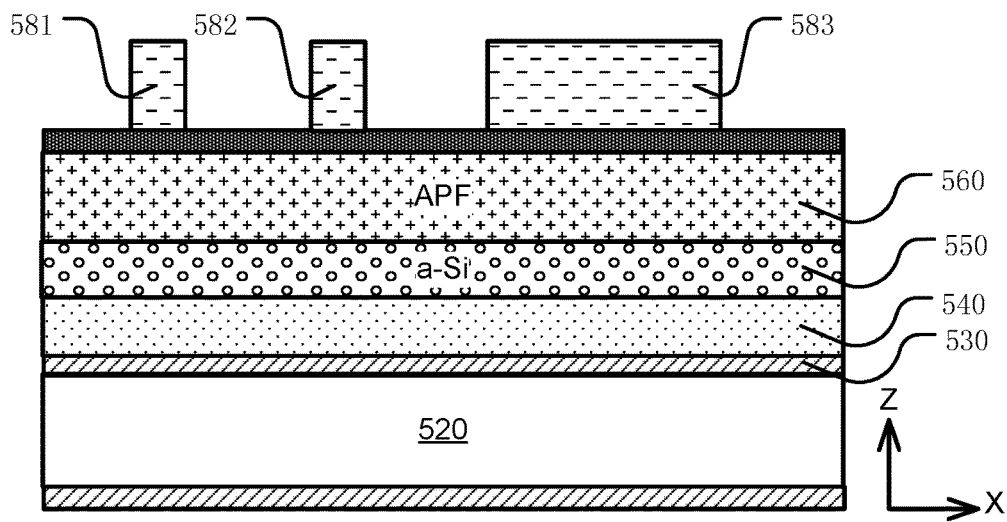
FIGS. 5 to 12 illustrate results of manufacturing steps at a cross-section taken at line AA through a mask area between two mask lines, as shown in FIG. 3.

FIG. 5 shows a cross-section of a mask (e.g. 300, FIG. 3) formed over a substrate of an integrated circuit in an X-Z plane, taken at line AA through a mask area (e.g. 330a) between two mask lines (e.g. 331 and 342) as shown in FIG. 3. The substrate in this example has layers of materials including, from top to bottom, DARC (dielectric antireflective coating) 570, a layer of sacrificial material 560 such as APF (Advanced Patterning Film), a layer of semiconductor material 550 such as amorphous silicon, an insulation layer 540 that can include IMD (intermetal dielectric) oxide, and an etch stopping layer 530 that can include SiN (silicon nitride). The layers of materials can be formed on an array region 520 of an integrated circuit that includes an array of memory cells.

FIG. 5 shows a cross-section (e.g. 581) of a mask line (e.g. 311, FIG. 3), a cross-section (e.g. 582) of an adjacent mask line (e.g. 321, FIG. 3), and a cross-section (e.g. 583) of a mask area MA(3) (e.g. 330a, FIG. 3) connecting a first segment (e.g. 331, FIG. 3) of mask line ML(3) with a second segment (e.g. 342, FIG. 3) of mask line ML(4). The mask area MA(3) (e.g. 330a, FIG. 3) is disposed between mask line ML(3) and mask line ML(4).

Figure 6:
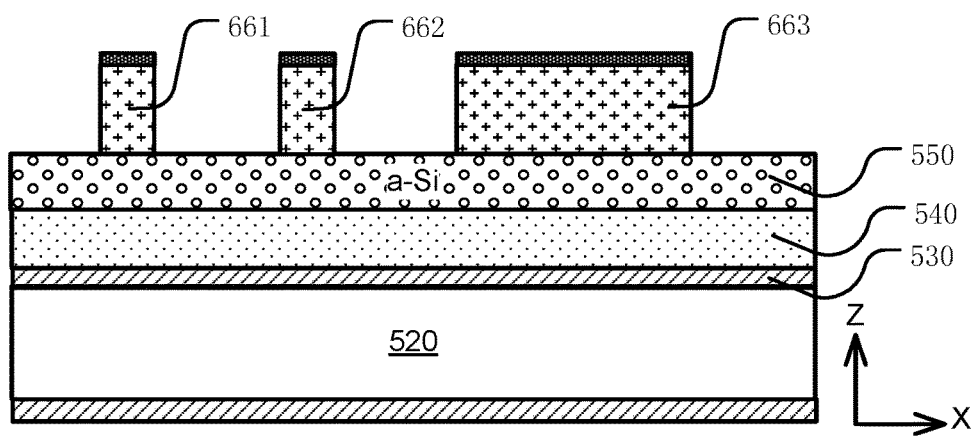

FIG. 6 shows the result of etching the layer of sacrificial material 560 using the mask 300 (FIG. 3), stopping at the layer of semiconductor material 550, and removing the mask 300. The etching step uses the mask (e.g. 300, FIG. 3), and produces a plurality of sacrificial strips (e.g. 661, 662) and a plurality of sacrificial areas (e.g. 63), corresponding to the plurality of mask lines (e.g. 581, 582) and the plurality of mask areas (e.g. 583) shown in FIG. 5.

Figure 7:
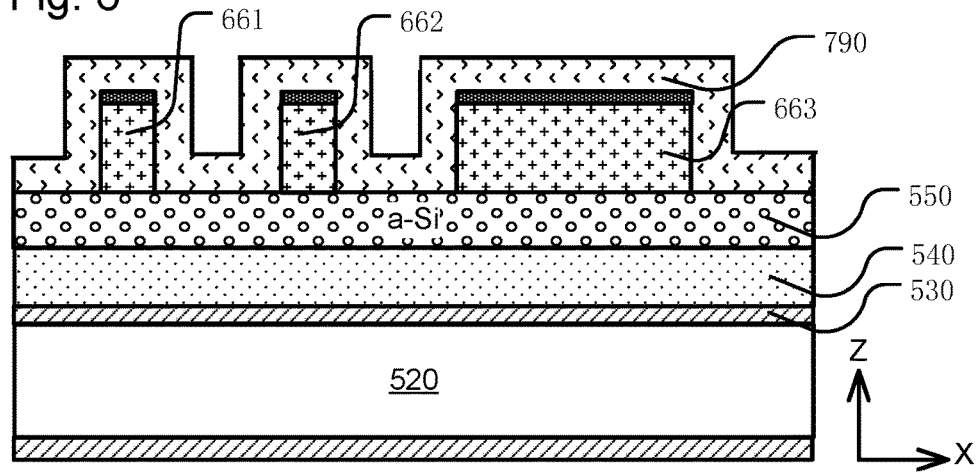

FIG. 7 shows the result of depositing a layer of spacer material (e.g. 790), such as a low temperature oxide, over the partially manufactured integrated circuit including the plurality of sacrificial strips (e.g. 661, 662) and the plurality of sacrificial areas (e.g. 663).

Figure 8:
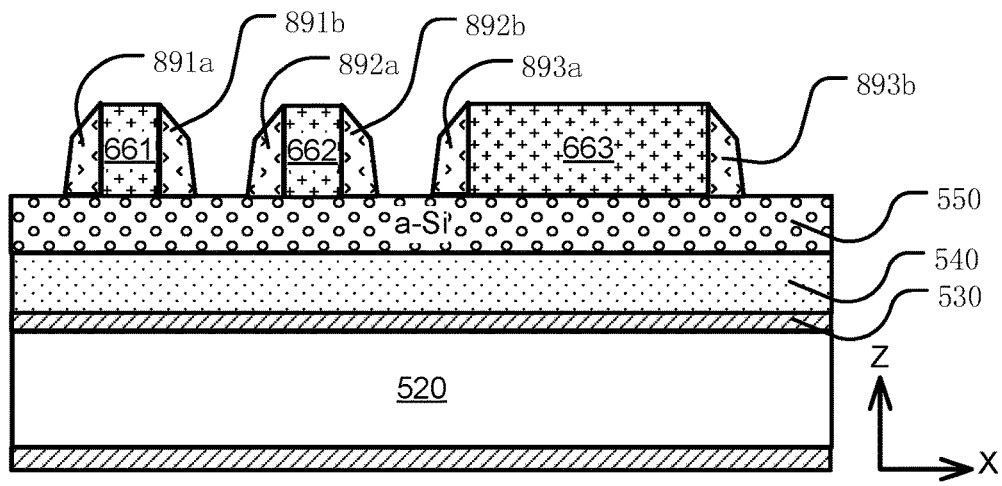

FIG. 8 shows the result of etching the layer of spacer material (e.g. 790, FIG. 7) to form sidewall spacers on the plurality of sacrificial strips and the plurality of sacrificial areas. For instance, sidewall spacers 891a and 891b are formed on sacrificial strip 661, sidewall spacers 892a and 892b are formed on sacrificial strip 662, and sidewall spacers 893a and 893b are formed on sacrificial area 663.

Figure 9:
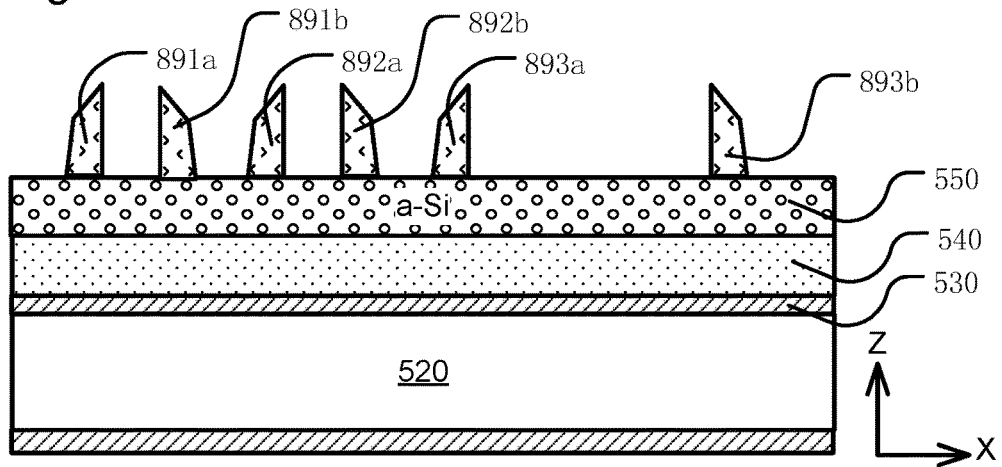

FIG. 9 shows the result of removing the plurality of sacrificial strips and the plurality of sacrificial areas, after the sidewall spacers are formed on the plurality of sacrificial strips and the plurality of sacrificial areas. After the plurality of sacrificial strips and the plurality of sacrificial areas are removed, the sidewall spacers (e.g. 891a, 891b, 892a, 892b, 893a, 893b) remain on the layer of semiconductor material 550.

Figure 10:
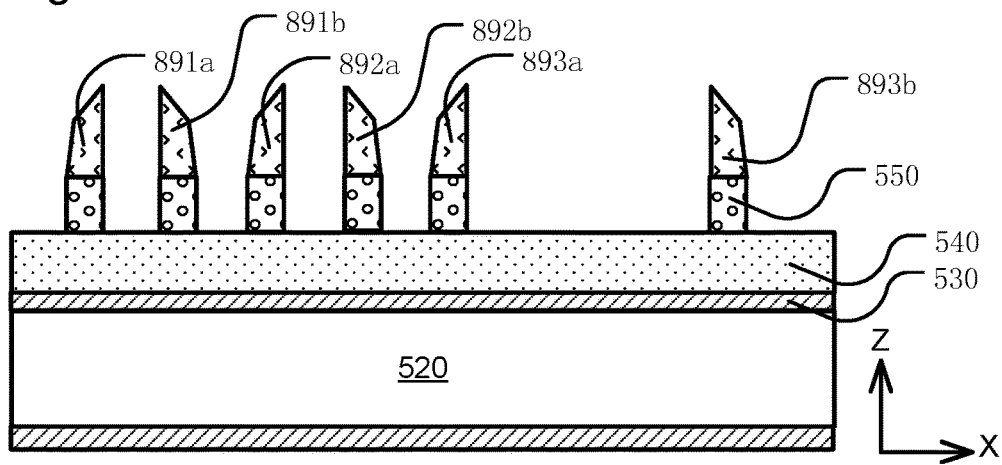

FIG. 10 shows the result of etching the layer of semiconductor material 550 using the sidewall spacers as an etch mask.

Figure 11:
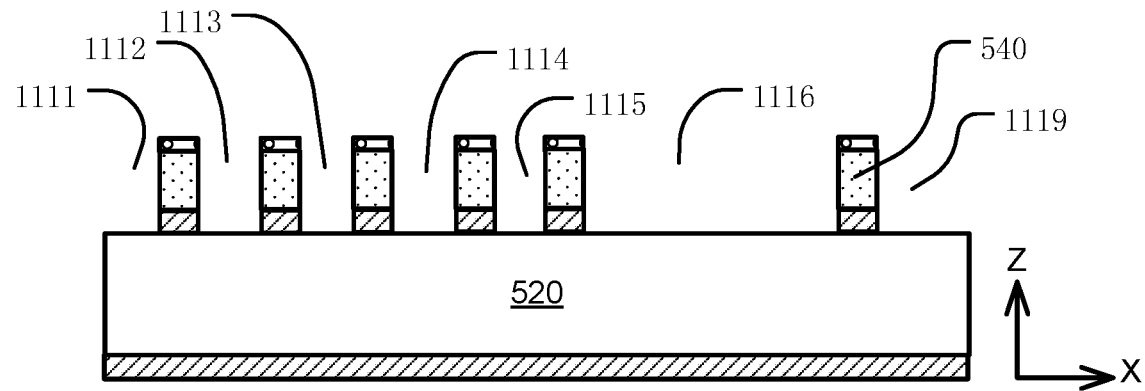

FIG. 11 shows the result of etching the insulation layer 540 under the layer of semiconductor material 550 to form trenches (e.g. 1111-1116, 1119) in the insulation layer. The sidewall spacers (e.g. 891a, 891b, 892a, 892b, 893a, 893b) are removed during the etching process to form the trenches (e.g. 1111-1116, 1119), since both the sidewall spacers and the insulation layer (e.g. 540) include oxide materials.

Figure 12:
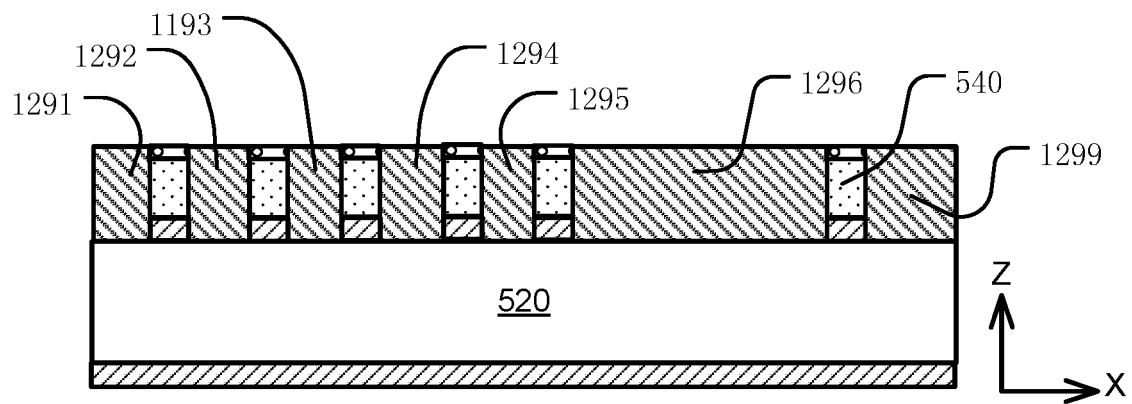

FIG. 12 shows the result of depositing a layer of material in the trenches (e.g. 1111-1116) to form a plurality of strips of material and a plurality of landing areas. The layer of material can include a conductive material such as copper. The cross-section shown in FIG. 12 can correspond to a cross-section taken at line CC through a landing area as shown in FIG. 1. For instance, strips 1291, 1292, 1293, 1294, 1295 and 1299 as shown in FIG. 12 can correspond to the first segments of strips 1, 2, 3, 4 and 5 and the second segment of strip 9 as shown in FIG. 1. Area 1296 as shown in FIG. 12 can correspond to landing area 160a connecting a first segment (e.g. 161) of strip S(6) with a second segment (e.g. 182) of strip S(8) as shown in FIG. 1, where landing area 160a is disposed between the first and second segments (e.g. 171, 172) of strip S(7). The plurality of strips of material and the plurality of landing areas are planarized after the layer of material is deposited in the trenches. The plurality of strips of material and the plurality of landing areas can be disposed in a metal level such as metal level 2.

Figure 13:
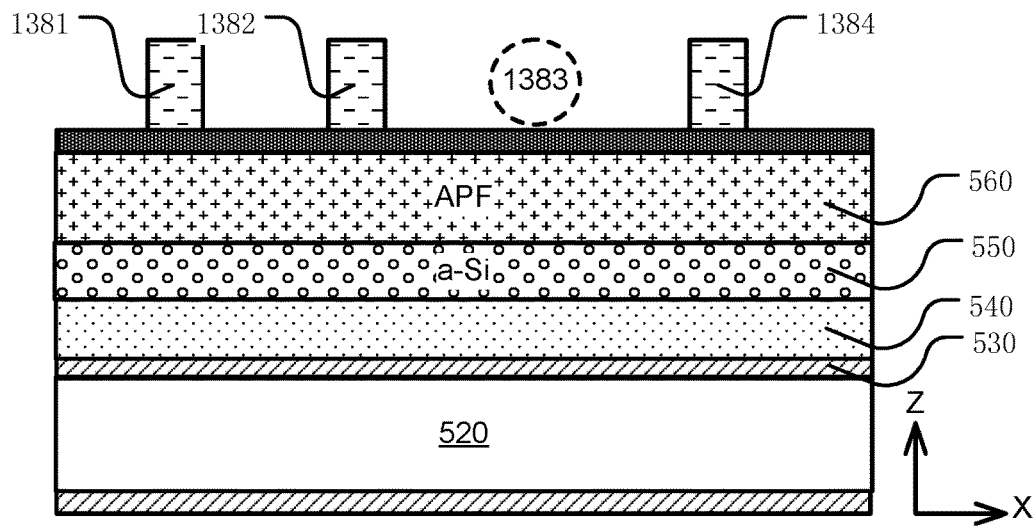
FIGS. 13 to 20 illustrate results of manufacturing steps at a cross-section through a mask gap in a mask line taken at line BB, as shown in FIG. 3.

FIGS. 13 to 20 illustrate results of manufacturing steps at a cross-section through a mask gap in a mask line taken at line BB, as shown in FIG. 3. FIG. 13 shows a cross-section of a mask (e.g. 300, FIG. 3) formed over a substrate of an integrated circuit, through a mask gap in a mask line taken at line BB, as shown in FIG. 3. The substrate has layers of materials as described in connection with FIG. 5.

FIG. 13 shows a cross-section (e.g. 1381) of the first segment of a mask line ML(1) (e.g. 311, FIG. 3), a cross-section (e.g. 1382) of the first segment of an adjacent mask line ML(2) (e.g. 321, FIG. 3), and a cross-section (e.g. 1384) of the second segment of a mask line ML(4) (e.g. 342, FIG. 3) in an X-Z plane. FIG. 13 also shows a mask gap 1383 disposed between cross-sections 1382 and 1384. The mask gap 1383 shown in FIG. 13 corresponds to the mask gap 331g shown in FIG. 3, disposed between the first and second segments of mask line ML(3) (e.g. 331 and 332) in a direction parallel to the mask lines, and between the first segment of mask line ML(2) and the second segment of mask line ML(4) (e.g. 321 and 342, FIG. 3) in a direction orthogonal to the mask lines.

Figure 14:
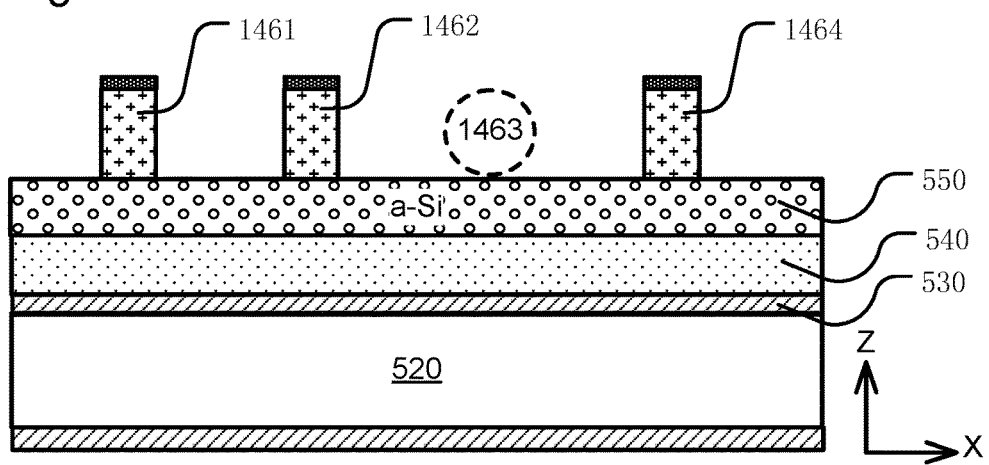

FIG. 14 shows the result of etching the layer of sacrificial material 560 using the mask 300 (FIG. 3), stopping at the layer of semiconductor material 550, and removing the mask 300. The etching step uses the mask (e.g. 300, FIG. 3), and produces a plurality of sacrificial strips (e.g. 1461, 1462, 1464), corresponding to the plurality of mask lines (e.g. 1381, 1382, 1384) shown in FIG. 13. The etching step forms a gap (e.g. 1463) between sacrificial strips (e.g. 1462, and 1464) in the layer of sacrificial material 560, corresponding to the mask gap 1383 shown in FIG. 13.

Figure 15:
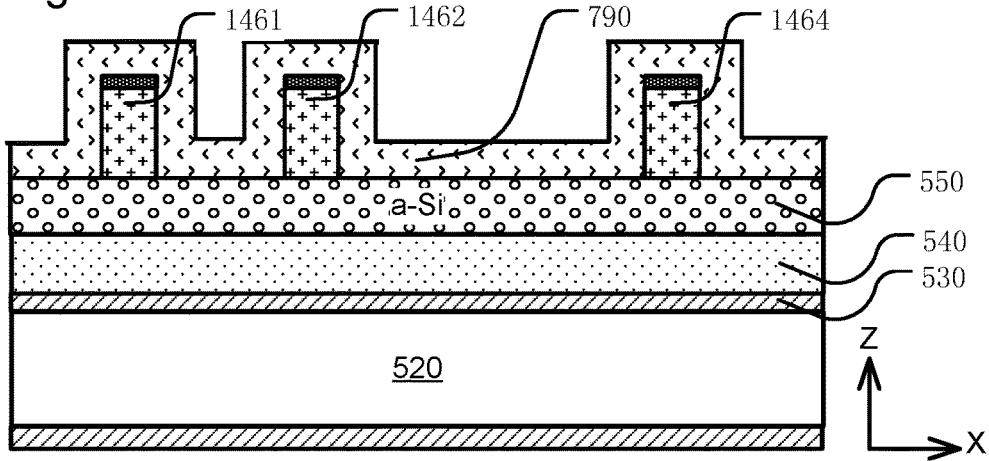

FIG. 15 shows the result of depositing a layer of spacer material (e.g. 790), such as a low temperature oxide, over the partially manufactured integrated circuit including the plurality of sacrificial strips (e.g. 1461, 1462, 1464), and the gap (e.g. 1463) between sacrificial strips (e.g. 1462, and 1464) in the layer of sacrificial material 560.

Figure 16:
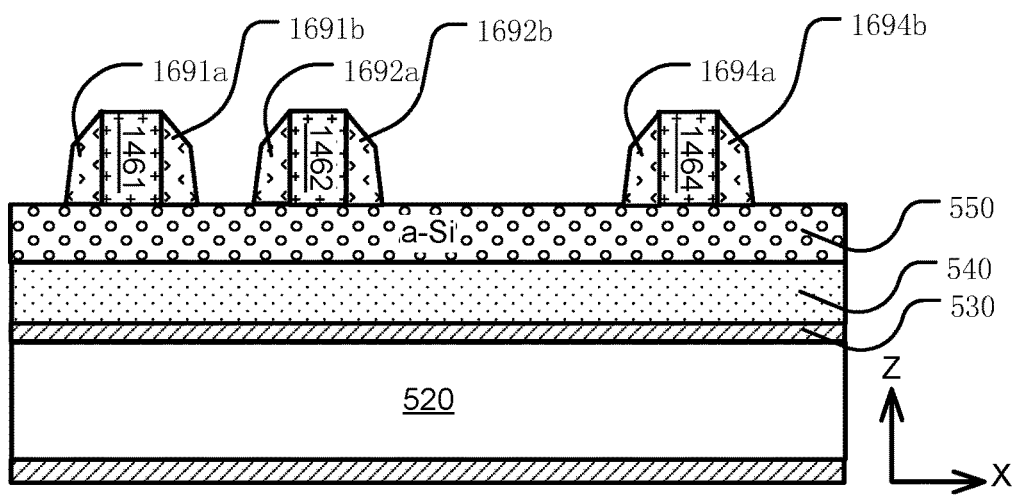

FIG. 16 shows the result of etching the layer of spacer material (e.g. 790, FIG. 7) to form sidewall spacers on the plurality of sacrificial strips and the plurality of sacrificial areas. For instance, sidewall spacers 1691a and 1691b are formed on sacrificial strip 1461, sidewall spacers 1692a and 1692b are formed on sacrificial strip 1462, and sidewall spacers 1494a and 1694b are formed on sacrificial area 1464.

Figure 17:
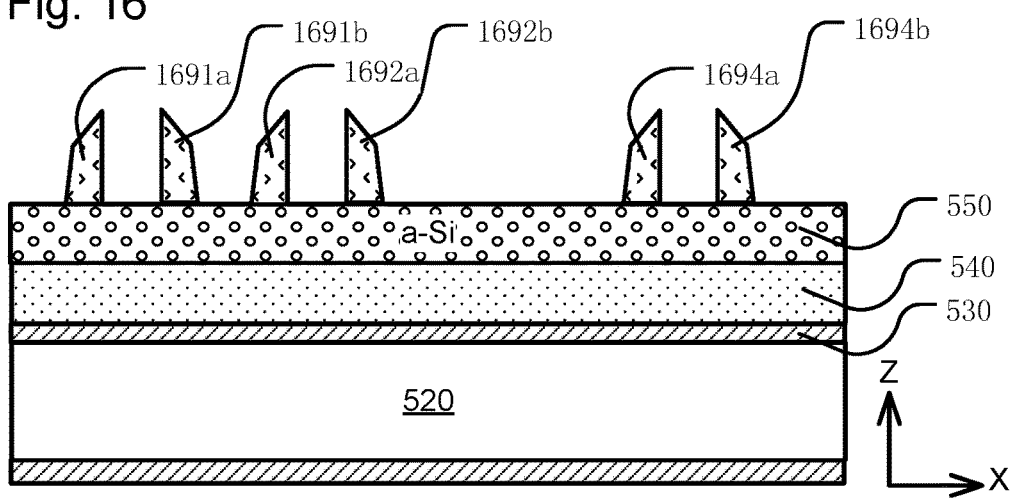

FIG. 17 shows the result of removing the plurality of sacrificial strips (e.g. 1461, 1462, 1464), after the sidewall spacers are formed on the plurality of sacrificial strips. After the plurality of sacrificial strips are removed, the sidewall spacers (e.g. 1691a, 1691b, 1692a, 1692b, 1694a, 1694b) remain on the layer of semiconductor material 550.

Figure 18:
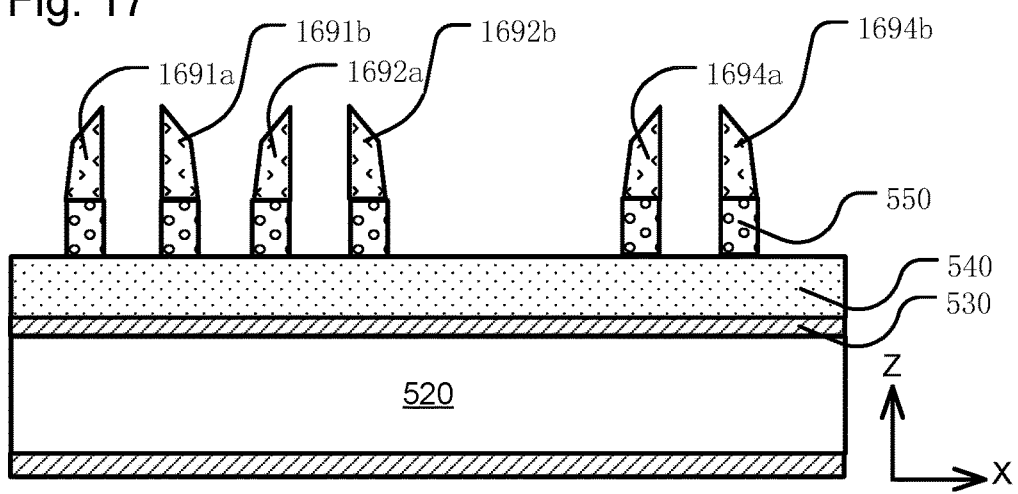

FIG. 18 shows the result of etching the layer of semiconductor material 550 using the sidewall spacers as an etch mask.

Figure 19:
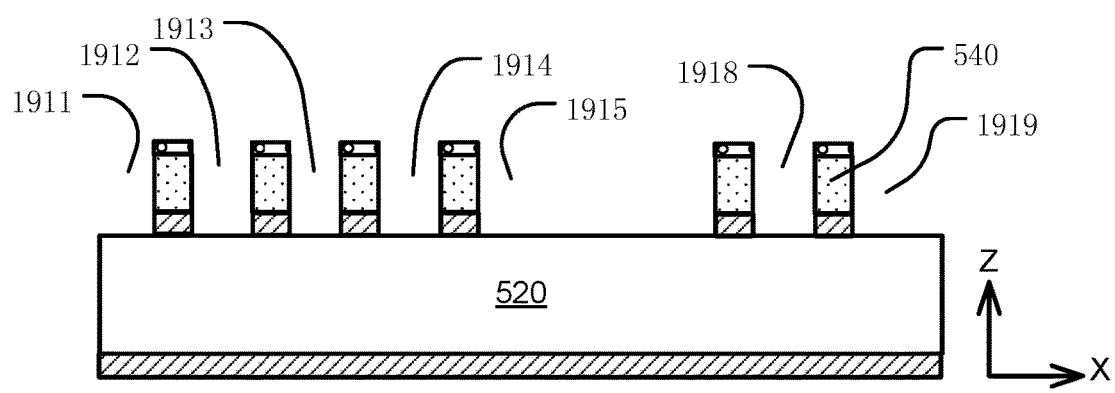

FIG. 19 shows the result of etching the insulation layer 540 under the layer of semiconductor material 550 to form trenches (e.g. 1911-1915, 1918, 1919) in the insulation layer using the sidewall spacers as an etch mask.

Figure 20:
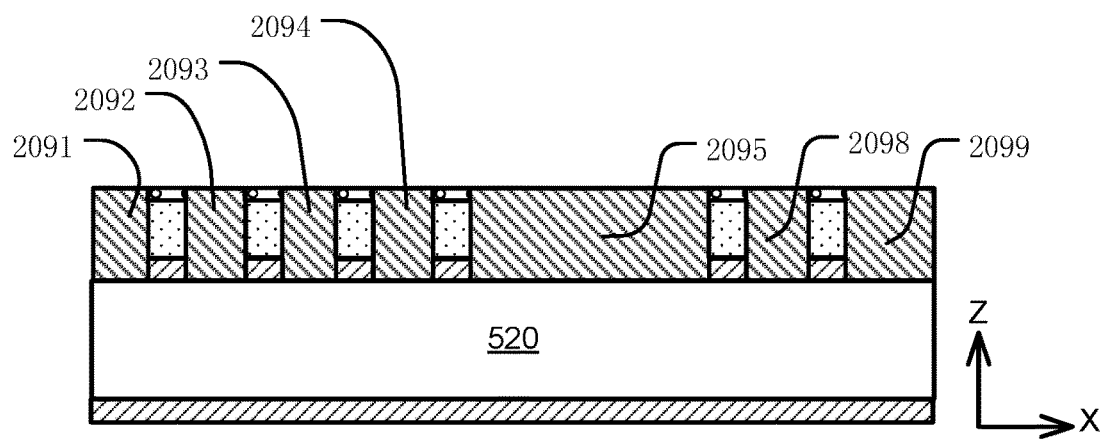

FIG. 20 shows the result of depositing a layer of material in the trenches (e.g. 1911-1915, 1918, 1919) to form a plurality of strips of material and a plurality of landing areas. The layer of material can include a conductive material such as copper. The cross-section shown in FIG. 20 can correspond to a cross-section taken at line DD through a landing area as shown in FIG. 1. For instance, strips 2091, 2092, 2093, 2094, 2098 and 2099 as shown in FIG. 20 can correspond to the first segments of strips 1, 2, 3 and 4 and the second segment of strips 8 and 9 as shown in FIG. 1. Area 2095 as shown in FIG. 20 can correspond to landing area 150*a* connecting a first segment (e.g. 151) of strip S(5) with a second segment (e.g. 172) of strip S(7) as shown in FIG. 1, where landing area 150*a* is disposed between the first and second segments (e.g. 161, 162) of strip S(6). The plurality of strips of material and the plurality of landing areas are planarized after the layer of material is deposited in the trenches. The plurality of strips of material and the plurality of landing areas can be disposed in a metal level such as metal level 2.

Figure 21A:
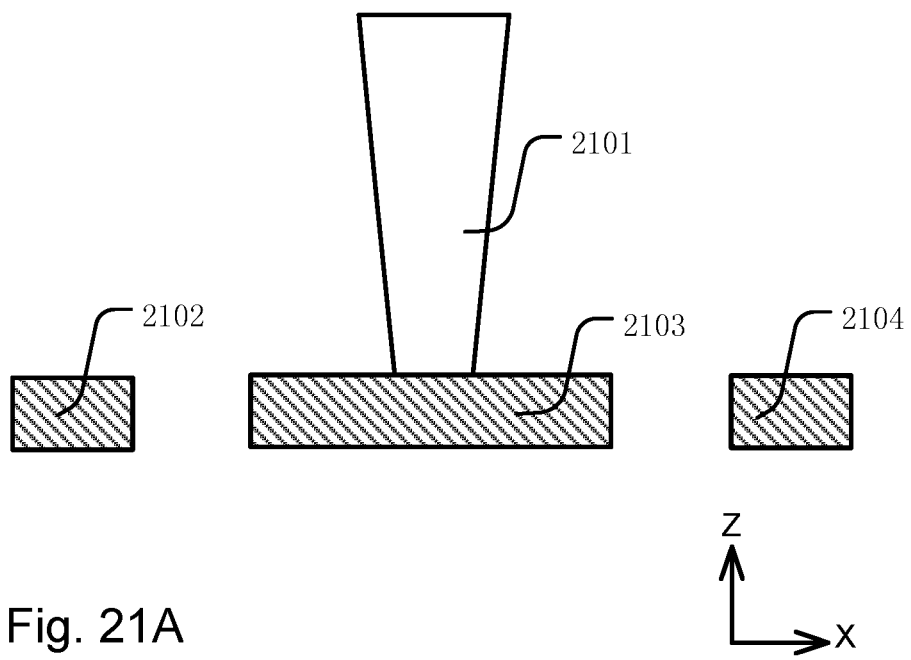
FIG. 21A shows a cross-section of a landing area and adjacent strips of material in an X-Z plane.

FIG. 21A shows a cross-section of a landing area and adjacent strips of material in an X-Z plane. A landing area (e.g. 2103) and adjacent strips of material (e.g. 2102 and 2104) shown in FIG. 21A can correspond to a landing area (e.g. 1296) and adjacent strips of material (e.g. 1295 and 1299) shown in FIG. 12, or correspond to a landing area (e.g. 2095) and adjacent strips of material (e.g. 2094 and 2098) shown in FIG. 20. For brevity, insulation materials between the landing area and the adjacent strips of material are omitted in FIGS. 21A and 21B.

An interlayer connector (e.g. 2101) can be formed on the landing area, for example using a different patterning step as for the landing areas and adjacent strips of material. The strips of material have a first pitch in a direction (e.g. X-direction) orthogonal to the strips, and the landing areas have a second pitch twice the first pitch in the direction orthogonal to the strips of material. The first pitch (e.g. P1) and the second pitch (e.g. P2) are illustrated in FIG. 1. In implementations, the interlayer connector can have a width less than the second pitch.

Figure 21B:
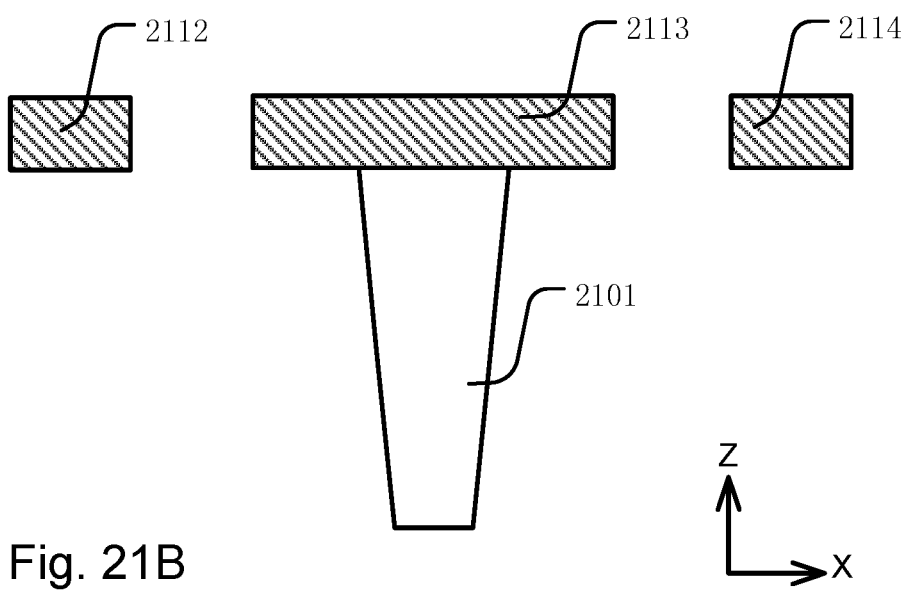
FIG. 21B shows a cross-section of a capping area and adjacent strips of material at a higher level than the landing area shown in FIG. 21A.

FIG. 21B shows a cross-section of a capping area and adjacent strips of material at a higher level than the landing area shown in FIG. 21A in an X-Z plane. A capping area (e.g. 2113) and adjacent strips of material (e.g. 2112 and 2114) at a higher level as shown in FIG. 21B can be aligned with, and be as dense or tightly pitched as, the landing area (e.g. 2103) and adjacent strips of material (e.g. 2102 and 2104) at a lower level as shown in FIG. 21A. The strips of material and the landing areas at the lower level and the higher level can include the high density patterned strips of material and landing areas, such as described in connection with FIGS. 1 and 2. An interlayer connector (e.g. 2101) can connect a landing area (e.g. 2103) at a lower level to a capping area (e.g. 2113) at a higher level.

FIG. 22A shows a second mask in addition to the first mentioned mask including mask lines ML(j), as described in connection with FIGS. 3 and 4. A second mask 2200 includes mask areas 2201 and 2202 shown in an X-Y plane for use with cutting the strip ends of the plurality of strips of material S(i) as shown in FIGS. 1 and 2. The second mask can also include other features (e.g. mask areas and open areas) for manufacturing components in a periphery region of the integrated circuit. Components in the periphery region can include, for example, controllers, voltage generators, address generators, command decoders, gates, patterned metal layers, etc. FIG. 22B shows the strip ends of the plurality of strips of material S(i) after being cut using the second mask. Both FIGS. 22A and 22B are shown in an X-Y plane.

Figure 23:
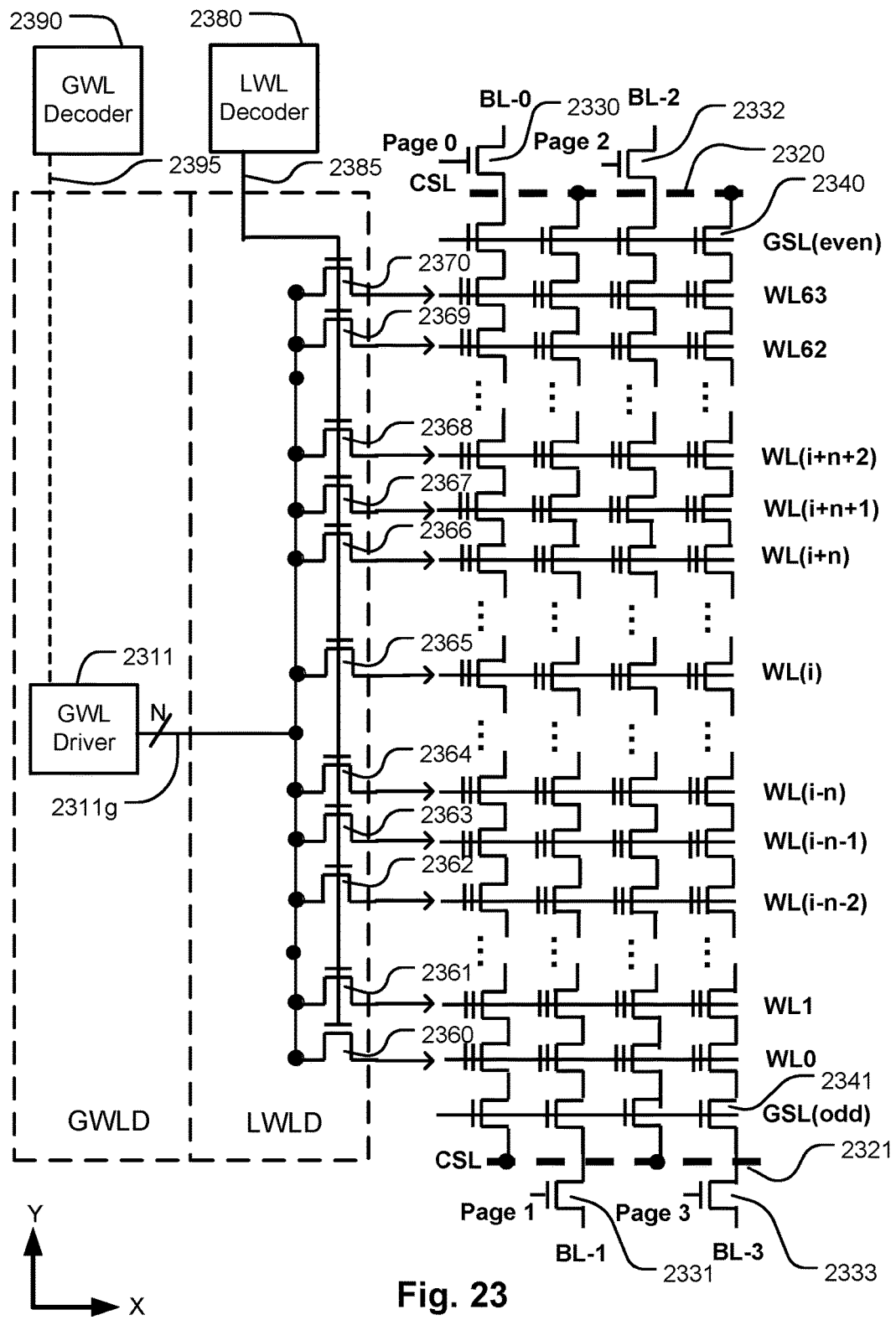
FIG. 23 is a circuit diagram showing example NAND strings in a block of memory cells connected to a configuration of local and global word line drivers in a 3D memory, where strips in a plurality of strips of material as described in connection with FIGS. 1 and 2 can be used.

FIG. 23 is a circuit diagram showing example NAND strings in an X-Y plane in a block of memory cells connected to a configuration of local and global word line drivers in a 3D memory, where strips in a plurality of strips of material as described in connection with FIGS. 1 and 2 can be used.

The NAND strings correspond to four pages of memory cells: Page 0, Page 1, Page 2 and Page 3. The NAND strings share even and odd ground select lines (GSL) for the even and odd pages, and have separate string select lines (SSL) coupled to global bit lines BL-N at even and odd bit line contact structures on opposing ends of the block, and to even and odd common source CS lines 2320 and 2321. The strings are connected to the corresponding global bit lines BL-0 to BL-3 by respective first string select switches (e.g. 2330, 2331, 2332 and 2333), also referred to as SSL switches. The strings are connected to the even or odd common source line for the plane by respective second string select switches (e.g. 2340, 2341), also referred to as ground select switches. A plurality of NAND strings in a block of memory cells has channel lines between the first string select switches and the second string select switches, and shares a set of word lines (e.g. WL0-WL1, WL(i−n−2), WL(i−n−1), WL(i−n), WL(i), WL(i+n), WL(i+n+1), WL(i+n+2), WL62-WL63) between the first and second string select switches. The memory can include a set of local word line drivers (e.g. 2360-2370), abbreviated as LWLD, that drives respective word lines in the set of word lines in a selected block of memory cells.

The memory can include a set of global word lines (e.g. 2311*g*) connected to a set of local word line drivers (e.g. 2360-2370) in the block of memory cells. The memory includes a global word line driver (e.g. 2311) that can drive the global word lines (e.g. 2311*g*), in which there are N global word lines provided in parallel for connection to selected blocks of memory cells in the memory by a local word line decoder (e.g. 2380) and local word line drivers in this example. Although only one block of even and odd pages is illustrated in this example, the global word lines can connect to the local word line drivers for many blocks in the memory. In implementations, the high density patterned strips of material and landing areas, such as described in connection with FIGS. 1 and 2, can implement the set of global word lines (e.g. 2311*g*), connecting the global word line driver (e.g. 2311) to the local word line drivers (e.g. 2360-2370).

A global word line decoder (e.g. 2390), abbreviated as GWL decoder, is connected to the global word line drivers using a conductor (e.g. 2395) in a patterned conductor layer. The conductor can carry one or more output signals to the global word line drivers. A local word line decoder (e.g. 2380), abbreviated as LWL decoder, is connected to the local word line drivers (e.g. 2360-2370) using conductors in patterned conductor layers, for connection of power signals, bias signals, address signals and/or other control signals to the local word line drivers. The connection from the local word line decoder 2380 can include a control signal line 2385 carrying control signals to each local word line driver in the first subset of the set of local word line drivers in the block, and to each local word line driver in the second sub-set of the set of local word line drivers in the block.

A local word line driver (e.g. 2366) can include an NMOS (N-type metal oxide semiconductor) transistor that has an input connected to a global word line (e.g. 2311*g*) in the set of global word lines, an output connected to a word line (e.g. WL(i+n)) in the set of word lines, and a control gate connected to a control signal (e.g. from control signal line 2385) from a local word line decoder (e.g. 2380). A global word line driver (e.g. 2311) can include a level shifter that shifts output voltage levels according to one or more output signals from a global word line decoder (e.g. 2390). For instance, the level shifter can vary the output voltage levels according to requirements by page erase operations, and according to requirements by read, write and block erase operations.

The high density patterned strips of material and landing areas, such as described in connection with FIGS. 1 and 2, can be used for other applications in integrated circuits. For instance, an integrated circuit including a memory array can include a page buffer coupled to the memory array, to a data path, to an ECC circuit, etc. The page buffer can include sense amplifiers and a program buffer. The sense amplifiers and the program buffer in the page buffer can be coupled with the memory array via data lines. The data path can be coupled to an input/output system, which in turn can be coupled to circuitry external to the integrated circuit. In implementations, the high density patterned strips of material and landing areas, such as described in connection with FIGS. 1 and 2, can be used for the data lines coupling the page buffer with the memory array.

While the present technology is disclosed by reference to the preferred embodiments and examples detailed herein, it is to be understood that these examples are intended in an illustrative rather than in a limiting sense. It is contemplated that modifications and combinations will readily occur to those skilled in the art, which modifications and combinations will be within the spirit of the technology and the scope of the following claims.

What is claimed is:

1. An integrated circuit comprising:
   a plurality of strips of material over a substrate, the plurality of strips including strips $S(i)$, each strip $S(i)$ for i going from 3 to n having a first segment and a second segment separated by a gap from the respective first segment; and
   a plurality of landing areas, the plurality of landing areas including landing areas $A(i)$, each landing area $A(i)$ for i going from 3 to n−2 connecting a first segment of strip $S(i)$ in the plurality of strips with a second segment of strip $S(i+2)$ in the plurality of strips, and disposed within the gap between the respective first and second segments in strip $S(i+1)$;
   wherein the strips $S(i)$ have a first pitch in a direction orthogonal to the plurality of strips, and the landing areas $A(i)$ have a second pitch twice the first pitch in the direction orthogonal to the plurality of strips of material.

2. The integrated circuit of claim 1, wherein the gaps in strips $S(i)$ have lengths in a direction parallel to the plurality of strips, and landing areas $A(i)$ have a width in the direction parallel to the plurality of strips less than a length of the gap between the first and second segments of strip $S(i+1)$, and adjacent landing areas $A(i)$ and $A(i+1)$ in the plurality of landing areas are offset in the direction parallel to the plurality of strips.

3. The integrated circuit of claim 2, wherein the offset is at least the length of the gap between the first and second segments of strip $S(i+1)$.

4. The integrated circuit of claim 2, wherein adjacent landing areas $A(i)$ and $A(i+1)$ in the plurality of landing areas have a pitch in the direction parallel to the plurality of strips equal to the length of the gap between the first and second segments of strip $S(i+1)$.

5. The integrated circuit of claim 1, wherein adjacent landing areas $A(i)$ and $A(i+1)$ in the plurality of landing areas are offset by the first pitch in the direction orthogonal to the plurality of strips of material.

6. The integrated circuit of claim 1, wherein for the strips $S(i)$, for i going from 3 to n, each strip $S(i)$ has a third segment separated by a gap from the second segment, further comprising:
   a second plurality of landing areas, the second plurality of landing areas including landing areas $A2(i)$, for i going from 3 to n, each landing area $A2(i)$ connecting the third segment of strip $S(i)$ in the plurality of strips with the second segment of strip $S(i+2)$ and disposed within the gap between the second and third segments in strip $S(i+1)$.

7. The integrated circuit of claim 6, wherein the landing areas $A2(i)$ in the second plurality have the second pitch twice the first pitch in the direction orthogonal to the plurality of strips of material.

8. The integrated circuit of claim 6, wherein the landing areas $A(i)$ in the first mentioned plurality and the landing areas $A2(i)$ in the second plurality are laid out in mirror image in the direction parallel to the plurality of strips.

9. A method of manufacturing an integrated circuit, comprising:
   forming a mask over a substrate, the mask including:
      a plurality of mask lines, the plurality of mask lines including mask lines $ML(j)$, each mask line $ML(j)$ for j going from 2 to m having a first segment and a second segment separated by a mask gap from the respective first segment; and
      a plurality of mask areas, the plurality of mask areas including mask areas $MA(j)$, each mask area $MA(j)$ for j going from 2 to m−1 connecting a first segment of mask line $ML(j)$ in the plurality of mask lines with a second segment of mask line $ML(j+1)$ in the plurality of mask lines, and disposed between mask line $ML(j)$ and mask line $ML(j+1)$; and
   executing a self-aligned double patterning process on the substrate using the mask, to manufacture the integrated circuit comprising:
      a plurality of strips of material over the substrate, the plurality of strips including strips $S(i)$, each strip $S(i)$ for i going from 3 to n having a first segment and a second segment separated by a gap from the respective first segment; and
      a plurality of landing areas, the plurality of landing areas including landing areas $A(i)$, each landing area $A(i)$ for i going from 3 to n−2 connecting a first segment of strip $S(i)$ in the plurality of strips with a second segment of strip $S(i+2)$ in the plurality of strips, and disposed within the gap between the respective first and second segments in strip $S(i+1)$;
      wherein the strips $S(i)$ have a first pitch in a direction orthogonal to the plurality of strips, and the landing areas $A(i)$ have a second pitch twice the first pitch in the direction orthogonal to the plurality of strips of material.

10. The method of claim 9, wherein the mask gaps in mask lines $ML(j)$ have a length in a direction parallel to the plurality of mask lines, and mask areas $MA(j)$ have a width in the direction parallel to the plurality of mask lines, and mask area $MA(j)$ between mask line $ML(j)$ and mask line $ML(j+1)$ and an adjacent mask gap in mask line $ML(j+1)$ are offset in the direction parallel to the plurality of mask lines.

11. The method of claim 10, wherein the offset is at least the length of the respective mask gaps or the width of the respective mask areas.

12. The method of claim 10, wherein the width of the respective mask areas is equal to the length of the respective mask gaps.

13. The method of claim 9, wherein adjacent mask areas $MA(j)$ and $MA(j+1)$ in the plurality of mask areas are offset by a pitch of the mask lines in a direction orthogonal to the plurality of mask lines.

14. The method of claim 9, wherein for the mask lines ML(j), for j going from 2 to m, each mask line ML(j) has a third segment separated by a mask gap from the second segment, further comprising:
- a second plurality of mask areas, the second plurality of mask areas including mask areas MA2(j), for j going from 2 to m−1, each mask area MA2(j) connecting the third segment of mask line ML(j) in the plurality of mask lines with the second segment of mask line ML(j+1) and disposed between mask line ML(j) and mask line ML(j+1).

15. The method of claim 14, wherein the mask gaps in mask lines ML(j) have a length in a direction parallel to the plurality of mask lines, and mask areas MA2(j) in the second plurality of mask areas have a width in the direction parallel to the plurality of mask lines, and mask areas MA2(j) in the second plurality of mask areas between mask line ML(j) and mask line ML(j+1) and an adjacent mask gap in mask line ML(j+1) are offset in the direction parallel to the plurality of mask lines.

16. The method of claim 15, wherein the offset is at least the length of the mask gaps or the width of the mask areas in the second plurality of mask areas.

17. The method of claim 15, wherein adjacent mask areas MA2(j) and MA2(j+1) in the second plurality of mask areas are offset by a pitch of the respective mask lines in a direction orthogonal to the plurality of mask lines.

18. The method of claim 15, wherein mask areas MA(j) in the first mentioned plurality of mask areas and mask areas MA2(j) in the second plurality of mask areas are laid out in mirror image in the direction parallel to the plurality of mask lines.

19. The method of claim 9, said executing a self-aligned double patterning process comprising:
- etching a layer of sacrificial material to form a plurality of sacrificial strips and a plurality of sacrificial areas corresponding to the plurality of mask lines and the plurality of mask areas in the mask;
- forming sidewall spacers on a layer of semiconductor material;
- etching the layer of semiconductor material using the sidewall spacers as an etch mask;
- etching an insulation layer under the layer of semiconductor material to form trenches in the insulation layer; and
- depositing a layer of material in the trenches to form the plurality of strips of material and the plurality of landing areas.

20. The method of claim 19, wherein said forming sidewall spacers comprises:
- depositing spacer material on the plurality of sacrificial strips and the plurality of sacrificial areas;
- etching the spacer material to form sidewall spacers on the plurality of sacrificial strips and the plurality of sacrificial areas; and
- removing the plurality of sacrificial strips and the plurality of sacrificial areas while the sidewall spacers remain.

* * * * *